US007246177B2

(12) United States Patent
Anton et al.

(10) Patent No.: US 7,246,177 B2
(45) Date of Patent: Jul. 17, 2007

(54) SYSTEM AND METHOD FOR ENCODING AND DECODING DATA FILES

(75) Inventors: Richard N. Anton, Jupiter, FL (US); James K. Etheridge, Jupiter, FL (US); Dustin W. Sias, Jupiter, FL (US); Robert G. Newland, Jr., Jupiter, FL (US)

(73) Assignee: Cyber Ops, LLC, Pelham, AL (US)

( * ) Notice: Subject to any disclaimer, the term of this patent is extended or adjusted under 35 U.S.C. 154(b) by 563 days.

(21) Appl. No.: 10/150,333

(22) Filed: May 17, 2002
(Under 37 CFR 1.47)

(65) Prior Publication Data

US 2003/0034905 A1    Feb. 20, 2003

Related U.S. Application Data

(60) Provisional application No. 60/291,815, filed on May 17, 2001.

(51) Int. Cl.
G06F 15/16    (2006.01)
G06F 3/00    (2006.01)

(52) U.S. Cl. .......................... 709/247; 709/201; 710/1

(58) Field of Classification Search ................ 709/201, 709/203, 223, 226, 227, 228, 247; 710/1
See application file for complete search history.

(56) References Cited

U.S. PATENT DOCUMENTS

| 5,740,028 | A | * | 4/1998 | Sugiyama et al. | .......... 725/149 |
| 5,805,827 | A | | 9/1998 | Chau et al. | .................. 709/247 |
| 5,974,471 | A | | 10/1999 | Belt | ........................... 709/247 |
| 6,321,266 | B1 | * | 11/2001 | Yokomizo et al. | .......... 709/226 |
| 2003/0059096 | A1 | * | 3/2003 | Dekel et al. | ................. 382/131 |

OTHER PUBLICATIONS

The Internet Engineering Task Force Request for Comments No. 2046, "Multipurpose Internet Mail Extensions (MIME) Part Two: Media Types," Nov. 1996, pp. 1-42.

The Internet Engineering Task Force Request for Comments No. 2068, "Hypertext Transfer Protocol—HTTP/1.1," Jan. 1997 (entire document [pp. 1-152] and Chapter 3 in particular.).

Chou et al., "A Robust Blind Watermarking Scheme Based on Distributed Source Coding Principles," Int'l Multimedia Conference 2000, Proceedings of the 8th ACM Int'l Conference on Multimedia, pp. 49-56.

(Continued)

*Primary Examiner*—Bharat Barot
*Assistant Examiner*—V. Korobov
(74) *Attorney, Agent, or Firm*—Smith, Gambrell & Russell

(57) ABSTRACT

Distributed compression of a data file can comprise a master server module for breaking the data file into data blocks and for transmitting the data blocks to worker server modules. A first worker server module can compress a first data block using a first compression algorithm, resulting in a first compressed data block. A second worker server module can compress the second data block using a second compression algorithm, resulting in a second compressed data block. The first and second compression algorithms can comprise the same algorithm or different algorithms. An archive module can save the first and second compressed data blocks in an archive file for storage or for transmission over a communication network. The worker server modules also can compress the respective data blocks using multiple compression algorithms and can choose the highest compressed result.

6 Claims, 14 Drawing Sheets

OTHER PUBLICATIONS

Zhao et al., "Broadcast System Source Codes: A New Paradigm for Data Compression," Signals, Systems, & Computers, 1999, Conference Record of the 33$^{rd}$ Asilomar Conference on, vol. 1, 1999, pp. 337-341.

Chiu et al., "Partial Video Sequence Caching Scheme for VOD Systems with Heterogeneous Clients," Industrial Electronics, IEEE Transactions on, vol. 45, Issue 1, Feb. 1998, pp. 323-332.

Jenkin et al., "A Plugin-Based Privacy Scheme for World-Wide Web File Distribution," System Sciences, 1998, Proceeding of the 31$^{st}$ Hawaii International Conference on, vol. 7, 1998, pp. 621-627.

Onufryk et al., "Consumer Devices for Networked Audio," ISIE '97 Proceeding of the IEEE International Symposium on, vol. 1, 1997, pp. SS27-SS32.

* cited by examiner

SYSTEM AND METHOD FOR ENCODING AND DECODING DATA FILES

PRIORITY AND RELATED APPLICATIONS

This application claims the benefit of priority to U.S. Provisional Patent Application Ser. No. 60/291,815, entitled "Xtream Management System," filed May 17, 2001. The complete disclosure of the above-identified priority application is fully incorporated herein by reference.

FIELD OF THE INVENTION

The present invention relates generally to the compression and decompression of data files. More particularly, the present invention relates to a system and method for compressing data files for storage or transmission over a communication network.

BACKGROUND OF THE INVENTION

Currently, many businesses conduct electronic commerce (e-commerce) utilizing a communication network such as the Internet as a means of connectivity to its customers and other businesses. The customers can access a business' web site to request web pages of information from the business. The web site then sends the requested web pages to the customers for their viewing on a user interface. Transfer protocols allow the transfer of data files between different users and different computer application programs in a distributed computing environment. For example, the most common transfer protocol used for transferring data on the Internet is the Hypertext Transfer Protocol (HTTP).

Known transfer protocols suffer from several disadvantages when transferring data over a communication network such as the Internet. For example, one problem with known transfer protocols involves the requirement to establish separate connections to retrieve each requested file. A web page typically comprises a root document file for the main web page and dependent document files referenced by the root document file. The dependent document files can comprise image files such as a JPEG file or a GIF file. Accordingly, when a user requests a web page, the transfer protocol requires a separate connection to transfer the root document file and each dependent document file. Each separate file connection requires overhead on web servers. The overhead can include additional network transfer, processing time, and memory usage. Additionally, each transfer protocol connection requires the exchange of protocol information for downloading the individual files, further increasing the bandwidth required to transfer the data files.

A conventional solution to the problem described above involves maintaining the transfer protocol connection open to allow for multiple file transfers during a single connection. The connection can remain open until all of the protocol and file data has been transferred. While that solution can limit the impact of connection overhead, it does not reduce the transfer protocol information required to download multiple related files.

Another conventional solution to the connection problem involves storing a number of files in an archive file and transferring the archive file over the communication network. However, to create the archive file, the user must manually select each document to include in the archive file. Additionally, when the archive file is received, it must be stored on a local storage medium and manually opened to separate the files. The user also must manually select which file to open after the files have been separated.

Another problem with known transfer protocols involves the transfer of only raw data. The raw data comprises uncompressed data, which can require large amounts of bandwidth to transfer it over the Internet. A conventional solution to that problem involves content encoding (compression), which reduces the data file's size. Content encoding can allow individual files to be compressed using one of several well-known compression methods prior to transfer. However, conventional methods only allow transfer of individual compressed files. Accordingly, that solution still requires the transfer protocol information for the transfer of each individual data file.

Finally, conventional transfer protocols cannot present web page data in a specified order. The data files are presented to the user in the order in which they are received. Even if the data files are transmitted in the desired order, the data files can arrive at the end user in a different order. Accordingly, the data files may be presented out of the desired order.

Conventional compression methods also contribute to inefficiencies in compressing the data files. For example, some conventional compression methods allow only one compression algorithm or sequence of compression algorithms to compress a file. More advanced compression techniques can allow choosing one of several methods for compressing an entire file or archive. However, those conventional techniques do not allow allocation of the most effective compression method to individual data files or data blocks. Accordingly, conventional compression techniques may use an inferior compression method on a data type.

Accordingly, there is a need in the art for a system and method that overcome the problems discussed above for transferring data files over a communication network. Specifically, a need exists for a system and method that can allocate the most efficient compression method to different data files or data blocks of those data files. A need in the art also exists for an efficient compression system and method that can compress data blocks in parallel to reduce the compression processing time. Furthermore, a need in the art exists for a compression system and method that can force the decompression order of data blocks or files, thereby forcing the presentation order of the data to a user.

SUMMARY OF THE INVENTION

The present invention can reduce required bandwidth for data communication by sending several files compressed together as one streaming web archive format. The web archive format can encapsulate many files into one file for storage or transfer over a communication network. Thus, the present invention can allow the transfer of all, or any subset of, a web page and its dependent files as one archive file. That aspect can require only one exchange of transfer protocol information, thereby reducing the overall bandwidth required for the transfer. The present invention also can reduce compression processing time by compressing multiple parts of a data file in parallel (at the same time).

One aspect of the present invention can comprise a compression management system using one or more master server modules and worker server modules in parallel to compress data blocks, thereby decreasing encoding and decoding time and optimizing compression of the data. The compression management system can configure and integrate multiple master server modules and multiple worker server modules to simultaneously share workloads in both a dedicated and shared resource scenario.

In one aspect of the present invention, a master server module can assign compression algorithms to each data block for execution by one or more worker server modules. The compression algorithms can be divided such that one or more algorithms, or sequences of algorithms, are assigned to each worker server module. Accordingly, processing of a data block by one worker server module can begin before the completion of a previous block by another worker server module. The worker server modules can apply their assigned algorithm to the data block and can send the results back to the master server module when complete.

Another aspect of the present invention can include a state compressor. A state compressor, when used for data compression, can reference previously stored data in a dynamically generated dictionary. The continuation of the compressor's state across block or file boundaries in an archive file can provide for arranging documents in a specific order for decompression. For example, an advertisement can be forced to display prior to displaying a requested web page by making decompression of the web page dependent upon decompression of the advertisement.

In another aspect of the present invention, a user can request a web page through an Internet browser. A proxy server module or a web server module can return the web page in a web archive format. The web archive format can encapsulate the entire web page including all supporting files into one compressed document and can transmit the entire document over one TCP/IP connection.

These and other aspects, objects, and features of the present invention will become apparent from the following detailed description of the exemplary embodiments, read in conjunction with, and reference to, the accompanying drawings.

DETAILED DESCRIPTION OF EXEMPLARY EMBODIMENTS

Figure 1:
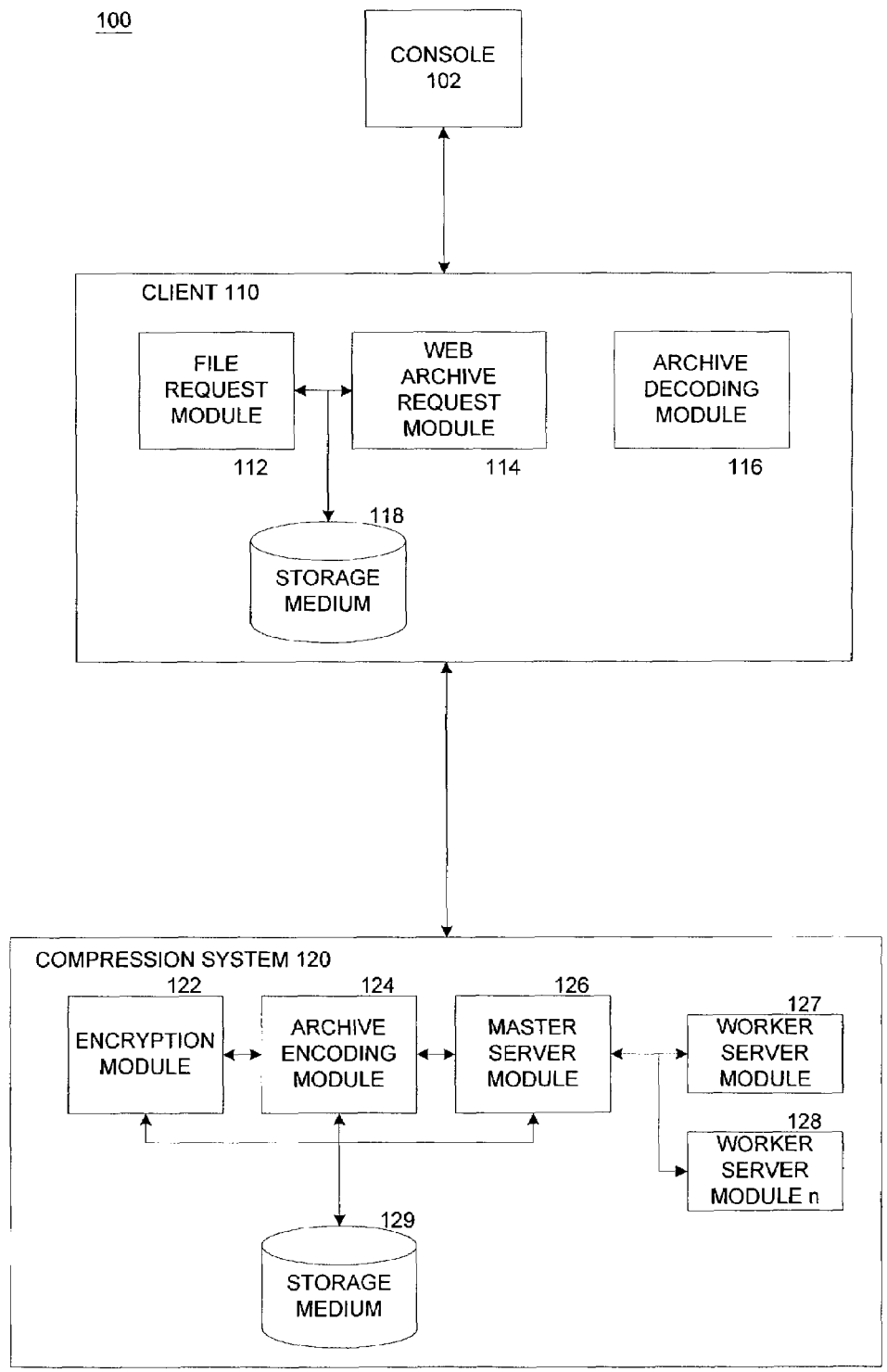
FIG. 1 is block diagram depicting a management system for compressing and decompressing data files according to an exemplary embodiment of the present invention.

Although the exemplary embodiments will be described generally in the context of software modules running in a distributed computing environment, those skilled in the art will recognize that the present invention also can be implemented in conjunction with other program modules for other types of computers. In a distributed computing environment, program modules may be physically located in different local and remote memory storage devices. Execution of the program modules may occur locally in a stand-alone manner or remotely in a client/server manner. Examples of such distributed computing environments include local area networks of an office, enterprise-wide computer networks, and the global Internet.

The detailed description that follows is represented largely in terms of processes and symbolic representations of operations in a distributed computing environment by conventional computer components, including master servers, worker servers, proxy servers, web servers, clients, web browsers, memory storage devices, consoles, and input devices. Each of those conventional distributed computing components is accessible via a communications network, such as a wide area network or local area network.

The processes and operations performed by the computer include the manipulation of signals by a client or server and the maintenance of those signals within data structures resident in one or more of the local or remote memory storage devices. Such data structures impose a physical organization upon the collection of data stored within a memory storage device and represent specific electrical or magnetic elements. Those symbolic representations are the means used by those skilled in the art of computer programming and computer construction to effectively convey teachings and discoveries to others skilled in the art.

The present invention also includes a computer program that embodies the functions described herein and illustrated in the appended flow charts. However, it should be apparent that there could be many different ways of implementing the invention in computer programming, and the invention should not be construed as limited to any one set of computer program instructions. Further, a skilled programmer would be able to write such a computer program to implement the disclosed invention based on the flow charts and associated description in the application text. Therefore, disclosure of a particular set of program code instructions is not considered necessary for an adequate understanding of how to make and use the invention. The inventive functionality of the claimed computer program will be explained in more detail in the following description in conjunction with the Figures illustrating the program flow.

Referring now to the drawings, in which like numerals represent like elements, aspects of the present invention and an exemplary operating environment will be described.

FIG. 1 is block diagram depicting a management system 100 for compressing and decompressing data files according to an exemplary embodiment of the present invention. The system 100 can comprise a console 102, a client 110, and a compression system 120. The console 102 can communicate information from the client 102 to a user. The console 102 typically comprises a graphical user interface for presenting and managing data in a convenient format for the user. The console 102 also typically comprises a keyboard and a mouse or other devices to allow the user to interact with the client 110. The console 102 also can be operable for receiving information from and controlling the client 110 and the compression system 120.

The client 110 can comprise a data file request module 112 for requesting compression of individual data files by the compression system 120. The client 110 also can comprise a web archive request module 114 for requesting compression of web page data files by the compression system 120. A web page data file can comprise a root document file of the web page and any document referred to by the root document file. Document files referred to by the root document file are called dependent document files. For example, a dependent document file can comprise an image file for displaying on the web page.

For the data file request module 112 and the web archive request module 114, each module can request compression of data files stored in a local storage medium 118 of the client 110. For example, the local storage medium can comprise a hard drive, floppy disk, RAM, ROM, a DVD/CD-ROM, etc. The user can transfer the data files from the storage medium 118 to the compression system 120 with the compression request from the data file request module 112 or the web page request module 114.

The compression system 120 can comprise an archive encoding module 124. The archive encoding module 124 can receive data file and web page compression requests from the data file request module 112 and the web archive request module 114, respectively. Accordingly, the archive encoding module 124 can receive with the request one or more data files for compression. The archive encoding module 124 can determine whether to compress the data files locally or whether to use distributed compression. Then, the archive encoding module 124 can transfer the data files to a master server module 126. In an exemplary embodiment, the master server module 126 can be integral to the archive encoding module 124. Alternatively, the master server module 126 and the archive encoding module 124 can operate as separate modules executing on different computers.

For local compression, the archive encoding module 124 can send a data file to the master server module 126. The master server module 126 can receive and compress the data file. Then, the master server module 126 can return the compressed data file to the archive encoding module 124.

For distributed compression, the archive encoding module 124 can send a data file to the master server module 126. The master server module 126 can receive the data file and can break the data files into blocks. The master server module 126 can transmit the data blocks individually to a worker server module 127, 128. Multiple worker server modules 127, 128 can compress individual data blocks in parallel (at the same time) and can return the compressed blocks to the master server module 126. The master server module 126 can assemble the data blocks in the proper order and can transmit the compressed data blocks to the archive encoding module 124.

In an exemplary embodiment, the worker server modules 127, 128 can comprise independent computing machines operating in parallel.

Accordingly, the compression system 120 can increase compression processing speed through parallel compression of data blocks at the same time by the worker server modules 127, 128. Additionally, the compression system 120 can increase the compression ratio by allowing use of a more sophisticated compression algorithm within a shorter compression processing time.

After receiving the compressed data blocks, the archive encoding module 124 can determine whether to encrypt a portion, or all, of the compressed data files. If encryption is selected, then the archive encoding module 124 can transmit the compressed data files to an encryption module 122 for encryption. The encryption module 122 can encrypt the desired portions of the data files and can return the encrypted, compressed data files to the archive encoding module 124. Then, the archive encoding module 124 can create an archive data file. The archive data file can comprise the individually compressed data blocks. Accordingly, the archive data file can comprise compressed versions of the processed data files. If necessary, the archive encoding module 124 can store the archive data file in a storage medium 129.

In an exemplary embodiment, the archive data file can comprise a web archive data file. The web archive data file can comprise a compressed version of the root document file and compressed versions of any dependent document files associated with the root document file.

The archive encoding module 124 can transmit the archive data file to the archive decoding module 116 of the client 110. The archive decoding module 116 can decompress the archived data file. The archive decoding module 116 can store the decompressed data file on the storage medium 118. Accordingly, the client 110 can increase storage space by compressing data files stored on the storage medium 118. The archive decoding module 116 also can transmit the decompressed data file to the console 102 for rendering on the user interface.

In an exemplary embodiment, the management system 100 can utilize multiple master server modules (not shown) and worker server modules in parallel to compress data blocks, thereby decreasing encoding time and optimizing compression of the data. The management system 100 can optimize processing power by configuring and integrating multiple master server modules and multiple worker server modules to share workloads in both a dedicated and shared resource scenario simultaneously.

Figure 2:
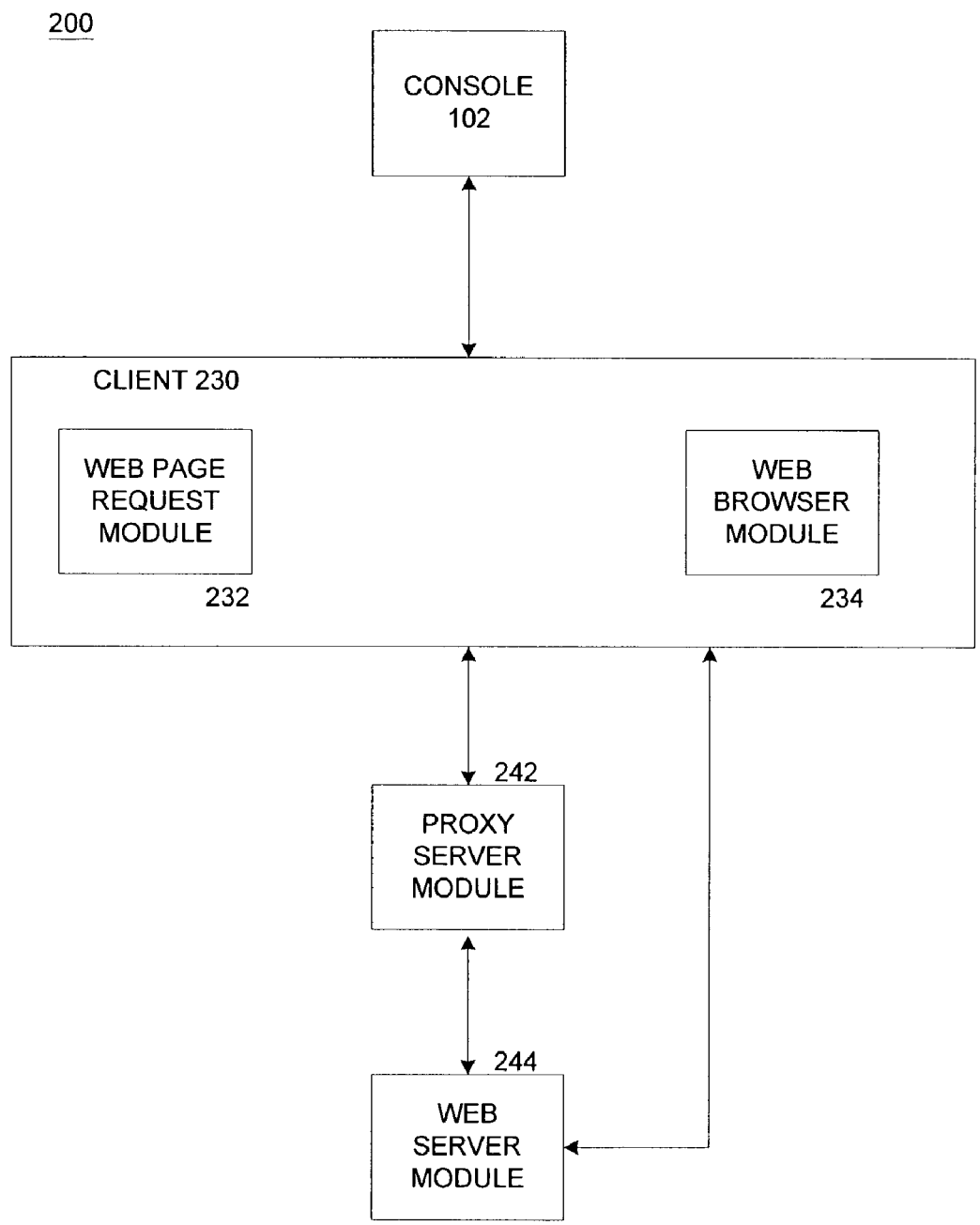
FIG. 2 is a block diagram depicting a management system for compressing and decompressing data files according to another exemplary embodiment of the present invention.

FIG. 2 is a block diagram depicting a management system 200 for compressing and decompressing data files according to another exemplary embodiment of the present invention. System 200 can comprise the console 102, a client 230, a proxy server module 242, and a web server module 244. The client 230 can comprise a web page request module 232 and a web browser module 234. The web page request module 232 can request a web page from the proxy server module 242 or the web server module 244.

After receiving the web page request from the web page request module 232, the proxy server module 242 or the web server module 244 can create a web archive data file. In an exemplary embodiment, the web archive data file can comprise a single compressed file associated with a requested web page.

In another exemplary embodiment, the web archive data file can comprise a compressed version of the root document file for the requested web page. Additionally, the web archive data file can comprise a compressed version of any dependent document files associated with the root document file. For example, the root document file can comprise the actual requested web page. The dependent document files can comprise files sent with, and supporting, the root document. For instance, a dependent document file can comprise an image file for displaying on the main web page.

The proxy server module 242, or the web server module 244, can transmit the web archive data file to the web browser module 234 of the client 230. The web browser module 234 can decompress the web archive data file and can transmit the decompressed data to the console 102 for rendering on the user interface.

Figure 3:
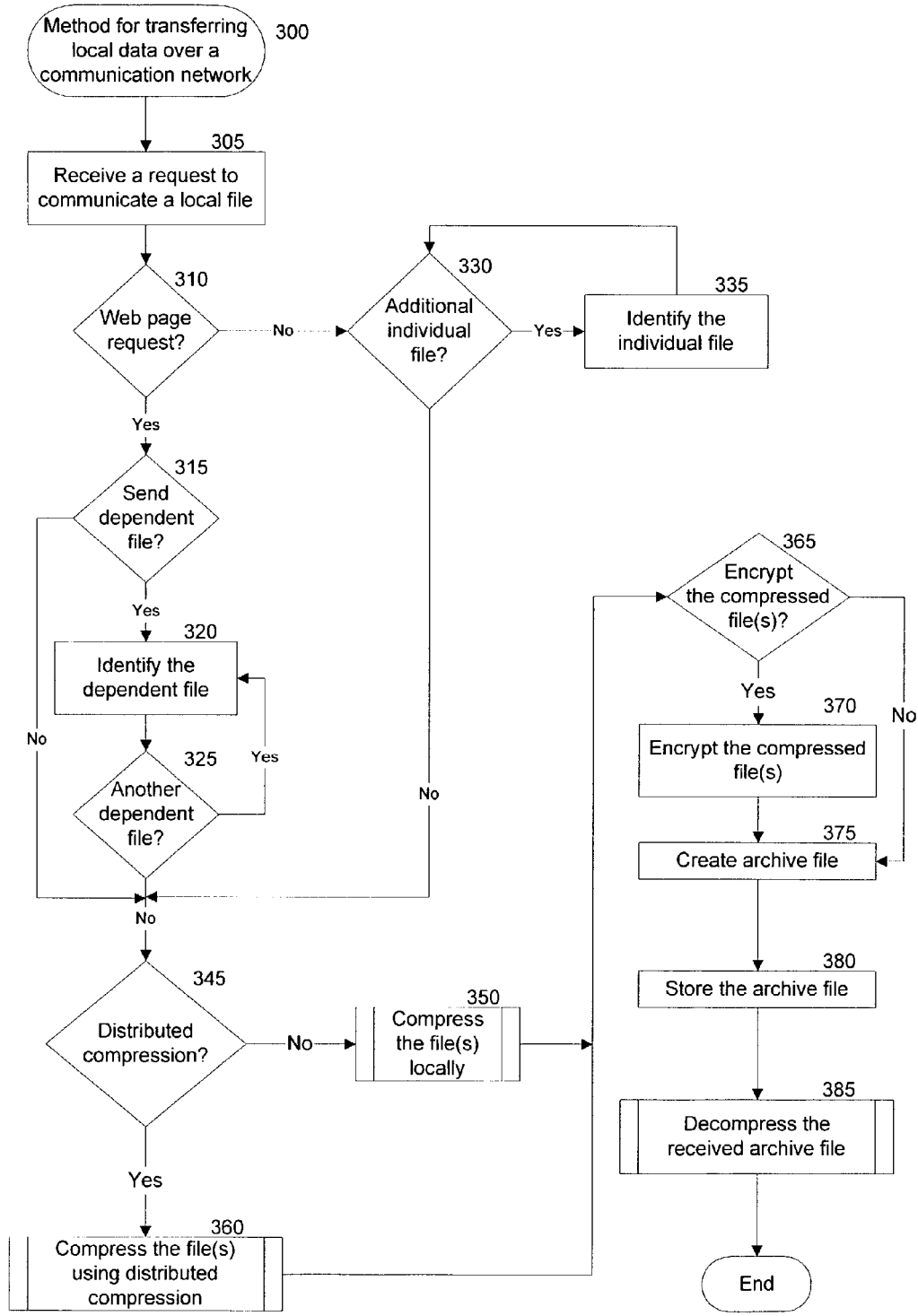
FIG. 3 is a flow chart depicting a method for compressing and decompressing a local data file according to an exemplary embodiment of the present invention.

FIG. 3 is a flow chart depicting a method 300 for compressing and decompressing a local data file according to an exemplary embodiment of the present invention. In step 305, the archive encoding module 124 (FIG. 1) of the compression system 120 can receive a request to communicate a local data file. For an individual data file, the request can originate from the file request module 112 of the client 110 and can include one or more data files for compression. For a web page data file, the request can originate from the web archive request module 114 and can comprise a root document file of the web page and any dependent document files for compression.

In step 310, the archive encoding module 124 can determine whether the request comprises a web page compression request. If yes, then the method can branch to step 315. In step 315, the archive encoding module 124 can determine whether the request comprises a request to send a dependent document file. For example, a user can configure the web archive request module 114 to request a dependent document file with the corresponding root document file. Alternatively, the user can specifically request a dependent document file in the request from the web archive request module 114. If the request comprises a request to send a dependent document file, then the method can branch to step 320.

In step 320, the archive encoding module 124 can identify the dependent document file. In step 325, the archive encoding module 124 can determine whether to send another dependent document file. If yes, then the method can branch back to step 320 to identify another dependent document file. If not, then the method can branch to step 345 to compress the data files.

Referring back to step 315, if the archive encoding module 124 determines that the request does not comprise a request to send a dependent document file, then the method can branch directly to step 345.

Referring back to step 310, if the archive encoding module 124 determines that the request does not comprise a web page request, then the method can branch to step 330. If the archive encoding module 124 determines that the request does not comprise a web page request, then the request comprises a request to compress one or more individual data files. In step 330, the archive encoding module 124 can determine if it received more than one individual data file for compression. If yes, then the method can branch to step 335.

In step 335, the archive encoding module 124 can identify the additional individual data file. The method then can repeat step 330. If the archive encoding module 124 determines in step 330 that the request does not comprise an additional individual data file, then the method can branch to step 345.

In step 345, the archive encoding module 124 can determine whether to use distributed compression to compress the requested data files. In an exemplary embodiment, that determination can be configurable by a user of the compression system 120. Alternatively, that determination can be based on selected parameters. For example, the parameters can comprise compression speed or compression ratio. The archive encoding module then can select either distributed or local compression based on which method meets the selected parameters.

In step 345, if the archive encoding module 124 determines to use distributed compression, then the method can branch to step 360. In step 360, the archive encoding module 124 can send the data files to the master server module 126 for distributed compression. The master server module 126 can be integral to the computer in which the archive encoding module 124 is located. Alternatively, the master server module 126 and the archive encoding module 124 can operate as separate modules on different computers.

Referring back to step 345, if the archive encoding module 124 determines not to use distributed compression, then the method can branch to step 350. In step 350, the archive encoding module 124 can send the data files to the master server module 126 for local compression. In that case, the master server module 126 can be integral to the computer in which the archive encoding module 124 is located.

From steps 350 or 360, the method can proceed to step 365. In step 365, the archive encoding module 124 can determine whether to encrypt the compressed data files. If not, then the method can branch to step 375. If yes, then the method can branch to step 370, in which the encryption module 122 can encrypt the compressed data files. In an exemplary embodiment, the encryption module 122 can encrypt each compressed data file or a single compressed data file. In another exemplary embodiment, the encryption module 122 can encrypt a portion of one or more compressed data files.

Block size within the compressed files can be variable. Additionally, compression and encryption options can be configurable on a per data block basis. Accordingly, a user can choose to encrypt selected portions of a data file. Such selective encryption can allow the encryption of sensitive portions from an entire collection of the data file. Alternatively, selective encryption can allow encrypting different data files with different keys to provide multiple levels of access. For example, encrypting portions of the archive data file separately can allow the creator of the file to grant access to portions of the archive data file without compromising the security of the entire archive data file. The method then can proceed to step 375.

In an exemplary embodiment, a user can identify sensitive portions of a text document. The data blocks associated with the sensitive portions can be marked when saving the data file. Accordingly, the encryption module 122 can identify and encrypt only the data blocks comprising the sensitive portions.

In step 375, the archive encoding module 124 can create an archive data file. The archive data file can comprise compressed versions of the requested data files.

After creating the archive data file, the method can proceed to step 380. In step 380, the archive encoding module 124 can store the archive data file. For example, the archive encoding module 124 can store the archive data file in the storage medium 129. Alternatively, the archive encoding module 124 can transmit the archive data file to the client 110. The client 110 can store the archive data file in the storage medium 118. Accordingly, the client's local data can be compressed and stored to increase available disk space.

After the compression and encryption process, the archive data file can be stored to await a request for decoding or for transfer to another location for processing. In step 385, the archive decoding module 116 of the client 110 can retrieve the archive data file from the storage medium 118 and can decompress the archive data file for rendering on the user interface of the console 102. After being decompressed, the data file can comprise the same format as the original data file.

The management system 100 can operate as a management system for existing compression and encryption methods, as well as improved compression and encryption methods for future use. Accordingly, the archive data file format is not dependent on a particular compression or encryption algorithm to perform the compression or encryption steps described herein. The archive data file format can utilize existing compression and encryption algorithms to perform the compression and encryption steps. Additionally, new or improved compression and encryption algorithms can be incorporated into the compression and encryption steps to produce the archive data file format.

Figure 4:
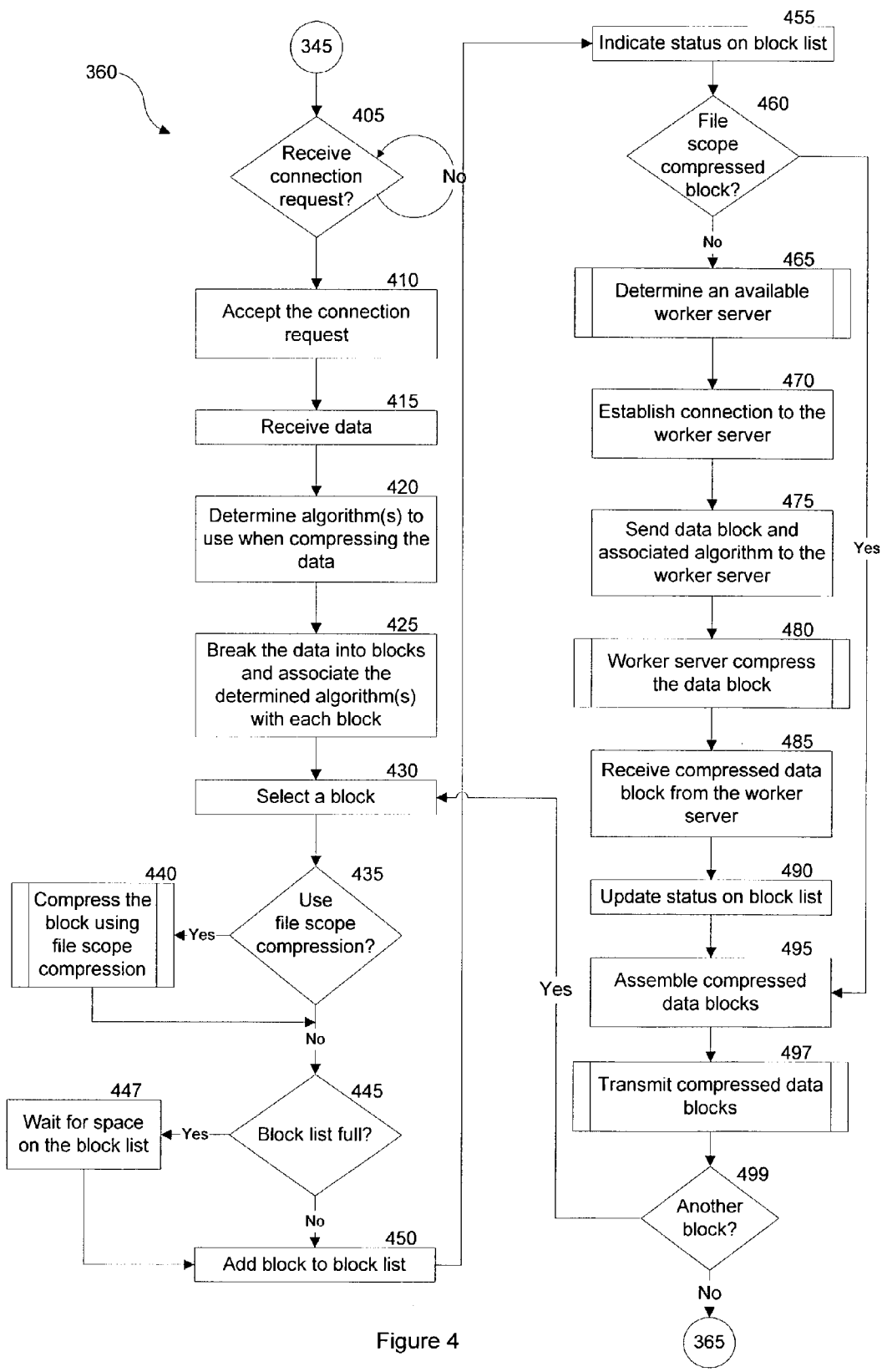
FIG. 4 is flow chart depicting a method for compressing a data file using distributed compression according to an exemplary embodiment of the present invention.

FIG. 4 is flow chart depicting a method for compressing a data file using distributed compression according to an exemplary embodiment of the present invention, as referred to in step 360 of FIG. 3. In step 405, the master server module 126 can determine whether it has received a connection request from the archive encoding module 124. If the master server module 126 has not received a connection request, then step 405 can be repeated. If the master server module 126 has received a connection request, then the master server module 126 can accept the connection request in step 410.

In step 415, the master server module 126 can receive data from the archive encoding module 124. The data can comprise one or more data files for compression. In step 420, the master server module 126 can identify one or more algorithms to use for compressing the received data. The master server module 126 can obtain a list of available algorithms from a static configuration file or a neural network configuration. The master server module 126 can determine which algorithms to apply to the respective data files by static configuration, selection based on filename extension, or selection based on calculated heuristics of all or part of the file. The calculated heuristics can comprise whether a histogram of byte values within all or part of the file is indicative of a primarily text document or a binary data file. Algorithms can be selected separately for each block within the file. The method then can proceed to step 425.

In an exemplary embodiment, the master server 126 can assign algorithms to each data block of the data files based on configurable compression settings. For example, if the compression setting is low, then the master server module 126 can assign one compression algorithm to each data block. If the compression setting is medium, then the master server module 126 can assign one or two compression algorithms to each data block. If the compression setting is high, then the master server module 126 can assign two or more compression algorithms to each data block. When the master server module 126 assigns more than one compression algorithm to a data block, each algorithm can be used to compress the block. Then, the most compressed result can be selected.

In step 425, the master server module 126 can break the received data files into blocks. Also, in step 425, the master server module 126 can associate the algorithms determined in step 420 with each block.

In an exemplary embodiment, the master server module 126 can determine algorithms for whole data files in step 420. Then, in step 425, the master server module 126 can associate the algorithms with data blocks corresponding to the algorithms that match the data file from which the data block originated.

In step 430, the master server module 126 can select a first block. Then, in step 435, the master server module 126 can determine whether to use file scope compression to compress the selected block. The determination whether to use file scope compression can be configurable. A user can select file scope compression when a forced ordering for decompressing the data files is desired. Additionally, file scope compression can be selected when compression ratio is more important than processing time, because file scope compression does not involve distributed compression.

If the master server module 126 elects to use file scope compression, then the method can branch to step 440. In step 440, the master server module 126 can compress the data block using file scope compression. The method then can proceed to step 445. If the master server module 126 determines in step 435 not to use file scope compression, then the method can branch directly to step 445.

In step 445, the master server module 126 can determine whether its block list is full. The block list can comprise an organization of existing blocks and each block's associated status. If the block list is full, then the method can branch to step 447. In step 447, the master server module 126 can wait until space in the block list becomes available. For example, space can become available when the master server module 126 transmits a compressed block to the archive encoding module 124. The method then can proceed to step 450.

Referring back to step 445, if the master server module 126 determines that the block list has available space, then the method can branch directly to step 450. In step 450, the master server module 126 can add the data block to the block list. In step 455, the master server module 126 can indicate a status of the data block on the block list. For example, the status can comprise compressed, compressed using file scope compression, not compressed, or compression in progress. The method then can proceed to step 460.

In step 460, the master server module 126 can determine whether the data block was compressed using file scope compression. If yes, then the method can branch to step 495 discussed below. If not, then the method can branch to step 465. In step 465, the master server module 126 can identify an available worker server module 127, 128. Then, in step 470, the master server module 126 can establish a connection to the available worker server module 127, 128. In step 475, the master server module 126 can send the data block and its associated algorithm(s) to the worker server module 127, 128.

In step 480, the worker server module 127, 128 can compress the data block and can transmit the compressed data block to the master server module 126. In step 485, the master server module can receive the compressed data block from the worker server module 127, 128. The master server module 126 can update the status of the data block on the block list in step 490. For example, the master server module 126 can update the data block's status from compression in progress to compressed.

Then, the master server module 126 can assemble compressed data blocks in step 495. For example, step 495 can comprise receiving the compressed data block and placing it in the proper order in relation to other compressed data blocks. Because the data blocks can be compressed by multiple worker servers 127, 128 using multiple algorithms, the master server module 126 can receive compressed data blocks from the worker servers 127, 128 that are out of order. The master server module 126 can store a compressed data block as needed until it can be placed in the proper order relative to other compressed data blocks.

In step 497, the master server module 126 can transmit compressed data blocks to the archive encoding module 124. The method then can proceed to step 499. In step 499, the master server module 126 can determine whether to compress another data block. If yes, then the method can branch back to step 430. If not, then the method can branch to step 365 (FIG. 3).

In an exemplary embodiment, the master server module 126 can assign algorithms for execution on each data block by the worker servers 127, 128. For example, the master server module 126 can divide the compression algorithms such that one or more algorithms, or sequences of algorithms, are assigned to each worker server to allow processing of one data block to begin before the completion of a previous data block.

Once a worker server module 127, 128 completes compression of a data block, the worker server module 127, 128 can begin processing the next data block. Additionally, the master server module 126 can implement a timeout function (not shown) for the worker server modules 127, 128 to perform the respective assigned data block processing. In an exemplary embodiment, if a worker server 127, 128 is not finished when the master server reaches its latency timeout for block processing, then all of the involved worker servers can cease work on their assigned data blocks. In that case, the master server module 126 can transmit the most compressed version of the data block that the worker server 127, 128 has completed. Alternatively, if the worker server module 127, 128 did not complete any compression algorithm for the data block, the master server module 126 can transmit a non-compressed version of the data block. Accordingly, the master server module can balance processing time and compression ratio to meet a specified delivery schedule.

The archive data file format of the exemplary embodiment can allow application of a variety of compression algorithms to any or all portions of a data file encapsulated during the archiving process. Accordingly, the exemplary embodiment can allow parallel processing on blocks of data from the same file to decrease compression processing time.

Figure 5:
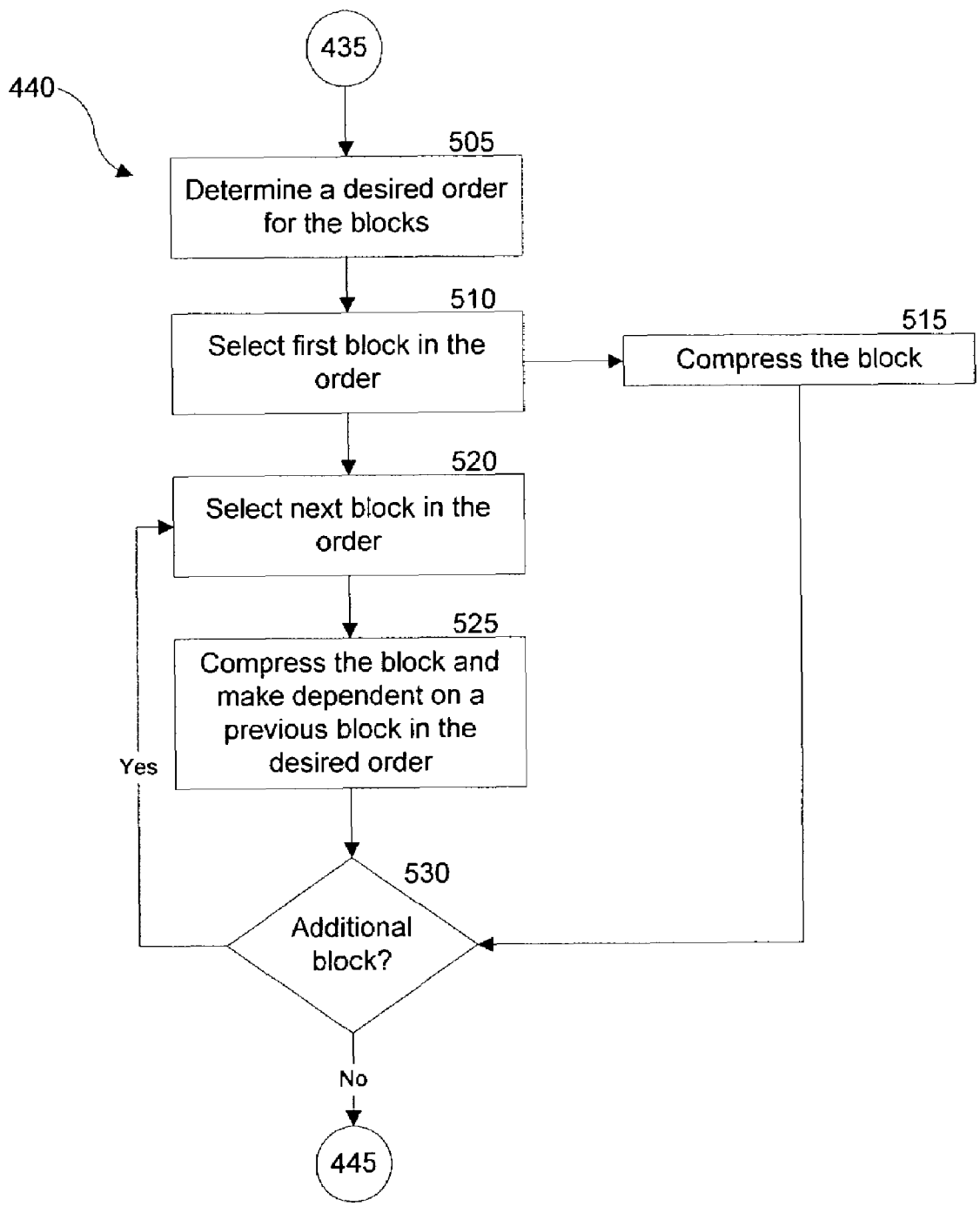
FIG. 5 is a flow chart depicting a method for compressing a data file using file scope compression according to an exemplary embodiment of the present invention.

FIG. 5 is a flow chart depicting a method for compressing a data block using file scope compression according to an exemplary embodiment of the present invention, as referred to in step 440 of FIG. 4. In step 505, the master server module 126 can determine a desired order for the data blocks of the data file. For example, a programmer can designate a priority of files in a web page. Then, the master server module 126 can read the designated priorities and can order the data blocks based on those priorities.

In step 510, the master server module 126 can select the first data block from the desired order. In step 515, the master server module 126 can compress the first data block. The method then can proceed to step 530 to determine whether to compress another data block. If yes, then the method can branch to step 520.

In step 520, the master server can select the next data block from the desired order. In step 525, the master server module can compress the selected block and can make the selected block dependent on a previous block in the desired order. The dependent relationship between the data blocks can be created using various methods. For example, conventional methods reset the state of the compression algorithm after the compression of each block or after the compression of each file. Accordingly, the temporary values used by the compression algorithm are also reset, thereby preventing a dependent relationship between the data blocks. In an exemplary embodiment of the present invention, the master server module 126 does not reset the state of the compression algorithm after each block. Accordingly, the temporary values used by the compression algorithm also are not reset after each block. Each block then can become dependent upon a previous block, because of the temporary values used throughout the compression process. In an alternative embodiment, the master server module 126 does not reset the state of the compression algorithm after each file. Accordingly, files can become dependent on decompression of another file.

By creating block or file dependencies in the compression process, the file scope compression method can force the decompression order for the blocks or files, respectively. Later blocks or files in the desired order cannot be decompressed until the earlier blocks or files in the desired order are decompressed. Additionally, the compression ratio of data files can be increased by compressing individual blocks or files as a group versus compressing individual files separately, because the compression process is not restarted for each data file.

For example, the management system 100 can support the application and use of a state compressor. A state compressor, when used for data compression, can reference previously stored data in a dynamically generated dictionary. The continuation of the compressor's state across block and/or file boundaries in an archive data file can allow arranging document files in a specific order for decompression. For example, an archive data file can be created in which an advertisement can be decompressed prior to displaying a requested web page. Accordingly, an advertiser can receive assurance that its advertisement is the first item displayed when viewing a web page.

From step 525, the method can proceed to step 530, discussed above. If the master server module 126 determines in step 530 not to process an additional block, then the method can branch to step 445 (FIG. 4).

Figure 6:
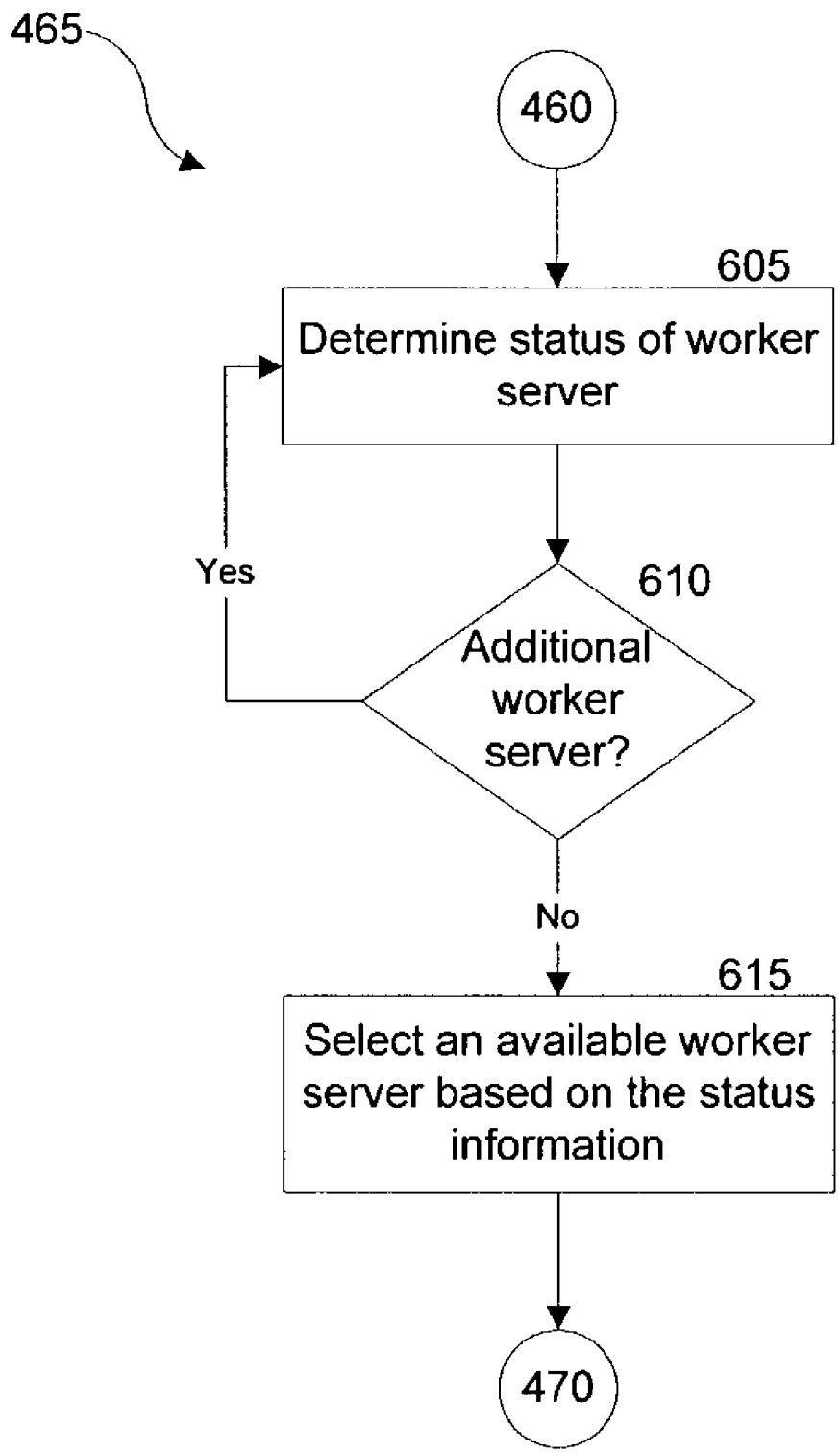
FIG. 6 is a flow chart depicting a method for determining an available worker server module according to an exemplary embodiment of the present invention.

FIG. 6 is a flow chart depicting a method for determining an available worker server module according to an exemplary embodiment of the present invention, as referred to in step 465 of FIG. 4. In step 605, the master server module 126 can determine a status of a worker server module 127, 128. For example, the status information can comprise excess processing capacity of a worker server module, a number of blocks currently being processed by the worker server module, a number of blocks capable of being processed by the worker server module, or a number of blocks sent for processing by the worker server module.

Alternatively, the master server module 126 can track each block sent to the worker server module 127, 128. The master server module 126 also can track the response for each block from the worker server module 127, 128. In that case, the status information can comprise whether the worker server module is currently compressing a block from the master server module 126.

From step 605, the method can proceed to step 610. In step 610, the master server module can determine whether to obtain status information for an additional worker server module 127, 128. If yes, then the method can branch back to step 605. If not, then the method can branch to step 615. In step 615, the master server module 126 can select an available worker server module 127, 128 based on the status information. The method then can proceed to step 470 (FIG. 4).

For example, the master server module can select an available worker server module 127, 128 based on status information indicating that the worker server module 127, 128 has completed processing of a data block. Alternatively, the master server module 126 can select an available worker server module based on the worker server module 127, 128 having the greatest excess processing capacity. In another exemplary embodiment, the master server module 126 can select the first available worker server module 127, 128.

Figure 7:
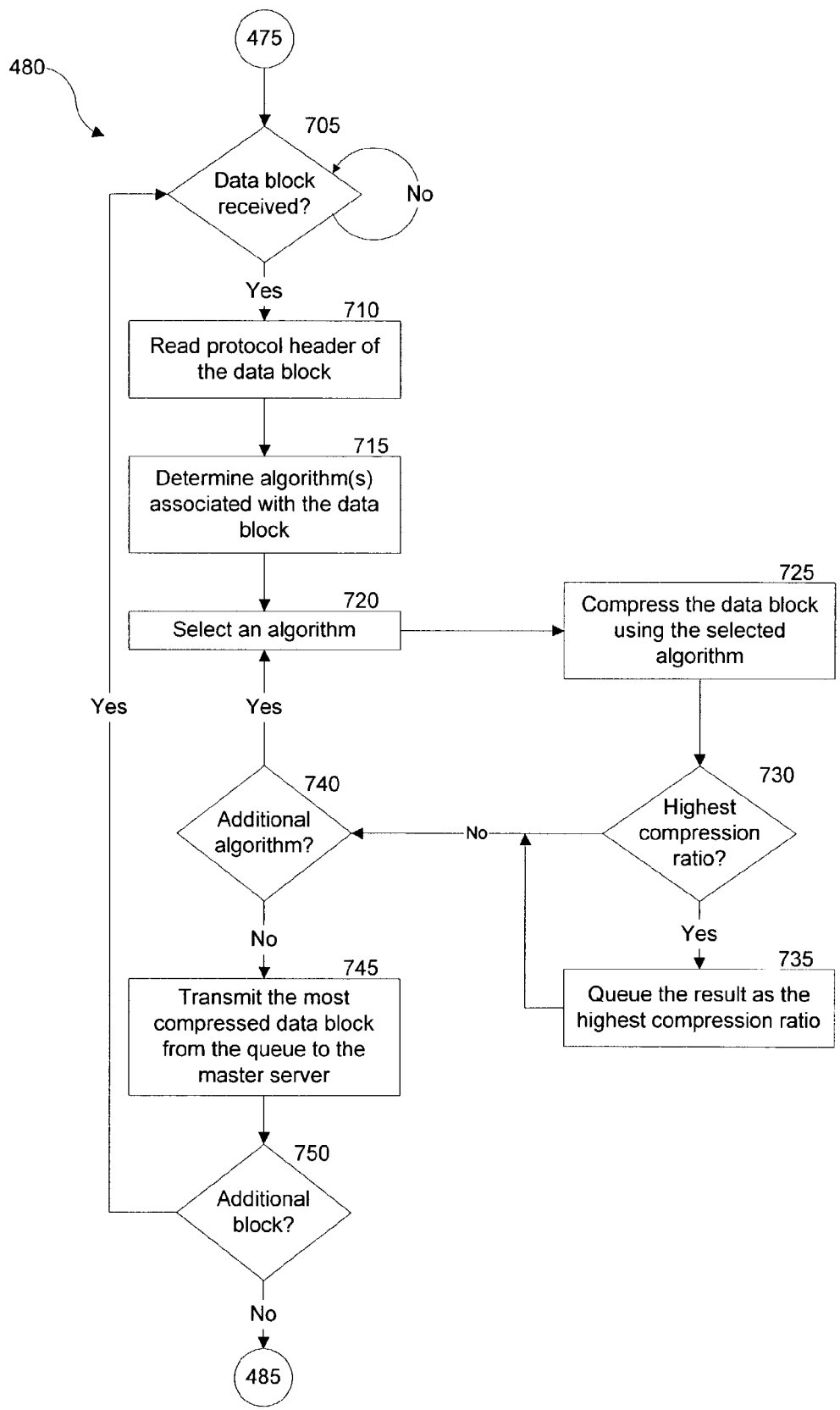
FIG. 7 is a flow chart depicting a method for compressing a data block by a worker server module according to an exemplary embodiment of the present invention.

FIG. 7 is a flow chart depicting a method for compressing a data block by a worker server module 127, 128 according to an exemplary embodiment of the present invention, as referred to in step 480 of FIG. 4. In step 705, the worker server module 127, 128 can determine whether it has received a data block to compress. If not, then the worker server module 127, 128 can repeat step 705 until it receives a data block. Once it receives a data block, then the method can branch to step 710.

In step 710, the worker server module 127, 128 can read a protocol header of the data block. The protocol header can provide various information about the data block. For example, the protocol header can indicate a size of the data block, the file type from which the data block originated, and the algorithm(s) associated with the data block. The protocol header also can indicate the version of the protocol in use to allow future changes to the protocol while providing backwards compatibility. In step 715, the worker server module 127, 128 can determine the algorithm(s) associated with the data block. The worker server module 127, 128 can obtain that information from the protocol header read in step 710. For example, the protocol header can indicate one algorithm associated with the data block. Alternatively, the protocol header can indicate a plurality of algorithms associated with the data block. The worker server module 127, 128 can refer to the algorithms in later steps to compress the data block.

In step 720, the worker server module 127, 128 can select an algorithm associated with the data block. Then, in step 725, the worker server module 127, 128 can compress the data block using the selected algorithm. In step 730, the worker server module 127, 128 can determine whether the compression process yielded the highest compression ratio for algorithms used thus far. If yes, then the method can branch to step 735. In step 735, the worker server module 127, 128 can queue the result as the highest compression ratio. The method then can proceed to step 740. If the worker server module 127, 128 determines in step 730 that the compression ratio was not the highest, then the method can branch directly to step 740.

In step 740, the worker server module 127, 128 can determine whether an additional algorithm is associated with the data block. If yes, then the method can branch back to step 720 to compress the data block using another algorithm. If not, then the method can branch to step 745.

In step 745, the worker server module 127, 128 can transmit the most compressed data block in the queue to the master server module 126. Then, in step 750, the worker server module 127, 128 can determine whether to wait for an additional data block to compress. If yes, the method can branch back to step 705. If not, the method can branch to step 485 (FIG. 4).

Figure 8:
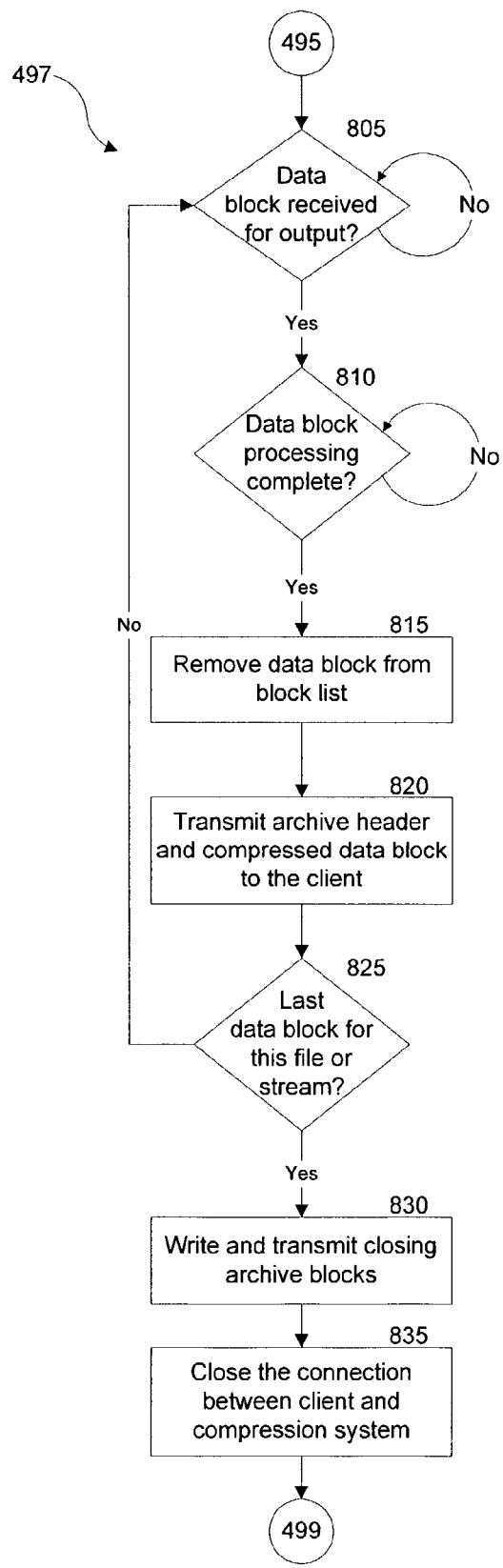
FIG. 8 is a flow chart depicting a method for transmitting compressed data blocks according to an exemplary embodiment of the present invention.

FIG. 8 is a flow chart depicting a method for transmitting compressed data blocks according to an exemplary embodiment of the present invention, as referred to in step 497 of FIG. 4. In step 805, the master server module 126 can determine whether it has received a data block for output to the archive encoding module 124. If not, then the master server module 126 can repeat step 805 until it receives a data block for output. If yes, then the method can branch to step 810. In step 810, the master server module 126 can determine whether processing of the data block is complete. For example, the master server module 126 can check the data block's status in the block list. For example, a compression in progress status can indicate that processing of the data block is not complete. If the processing of the data block is not complete, then the master server module 126 can repeat step 810 until the processing is complete. If the master server module 126 determines that processing of the data block is complete, then the method can branch to step 815.

In step 815, the master server module 126 can remove the data block from the block list. In step 820, the master server module 126 can output a data header and the compressed data block to the archive encoding module 124. Then, in step 825, the master server module 126 can determine whether the data block comprises the last data block for the data file or the stream. If not, then the method can branch back to step 805 to process another data block. If yes, then the method can branch to step 830.

In step 830, the master server module 126 can write closing data blocks for the data file or stream. Also, in step 830, the master server module 126 can transmit the closing data blocks to the archive encoding module 124. The closing data blocks can comprise an archive header. The archive header can provide a list of offsets to show locations of individual data files as they are stored in the archive data file by the archive encoding module 124. Then, in step 835, the master server module 126 can close the connection with the archive encoding module 124. The method then can proceed to step 499 (FIG. 4).

Figure 9:
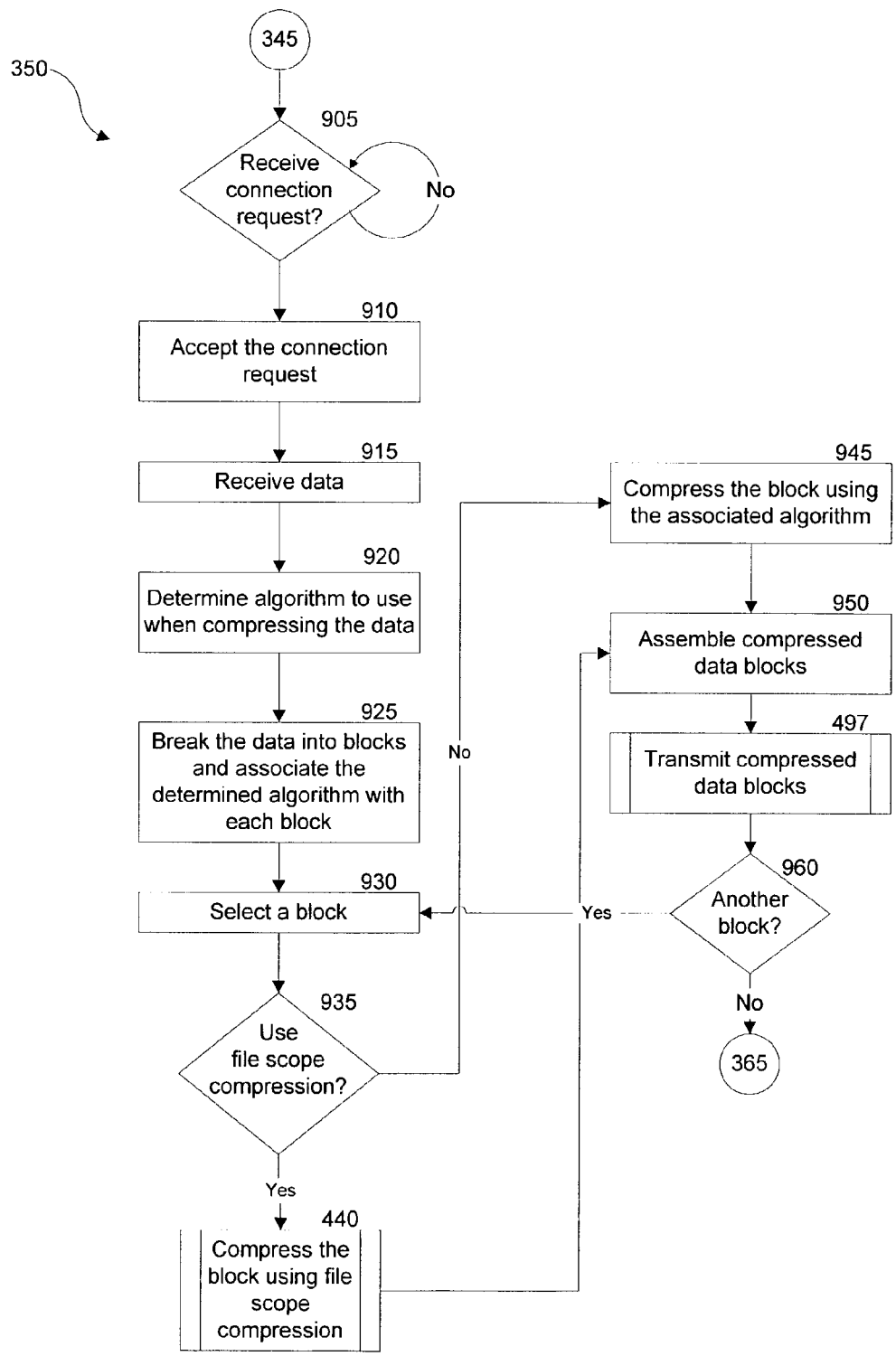
FIG. 9 is a flow chart depicting a method for locally compressing a data file according to an exemplary embodiment of the present invention.

FIG. 9 is a flow chart depicting a method for locally compressing a data file according to an exemplary embodiment of the present invention, as referred to in step 350 of FIG. 3. In step 905, the master server module 126 can determine whether it has received a connection request from the archive encoding module 124. If the master server module 126 has not received a connection request, then step 905 can be repeated. If the master server module 126 has received a connection request, then the master server module 126 can accept the connection request in step 910.

In step 915, the master server module 126 can receive data from the archive encoding module 124. The data can comprise one or more data files for compression. In step 920, the master server module 126 can identify one or more algorithms to use for compressing the received data. The master server module 126 can obtain a list of available algorithms from a static configuration file or a neural network configuration. The master server module 126 can determine which algorithms to apply to the respective data files by static configuration, selection based on filename extension, or selection based on calculated heuristics of all or part of the file. The calculated heuristics can comprise whether a histogram of byte values within all or part of the file is indicative of a primarily text document or a binary data file. Algorithms can be selected separately for each block within the file.

In step 925, the master server module 126 can break the received data files into blocks. Also, in the step 925, the master server module 126 can associate the algorithms identified in step 920 with each block, as described above with reference to FIG. 4.

In step 930, the master server module 126 can select a first block. Then, in step 935, the master server module 126 can determine whether to use file scope compression to compress the selected block. The determination whether to use file scope compression can be configurable. When locally compressing a file, file scope compression can provide an increased compression ratio. Additionally, file scope compression does not increase processing time for local compression, because local compression does not involve the faster distributed compression method.

If the master server module 126 determines to use file scope compression, then the method can branch to step 440. In step 440, the master server module 126 can compress the data block using file scope compression, as described above with reference to FIG. 5. The method then can proceed to step 950, described below.

If the master server module 126 determines in step 935 not to use file scope compression, then the method can branch to step 945. In step 945, the master server module 126 can compress the data block using the associated algorithm. In an exemplary embodiment, the master server can compress the data block as described for the worker server 127, 128 described above with reference to FIG. 7. The method then can proceed to step 950.

In step 950, the master server module 126 can assemble compressed data blocks. For example, step 950 can comprise placing the compressed data blocks in the proper order in relation to other compressed data blocks. The master server module 126 can store a compressed data block as needed until it can be placed in the proper order relative to other compressed data blocks.

In step 497, the master server module can transmit compressed data blocks to the archive encoding module 124, as described above with reference to FIG. 8. In step 960, the master server module 126 can determine whether to compress another data block. If yes, then the method can branch back to step 930. If not, then the method can branch to step 365 (FIG. 3).

Figure 10:
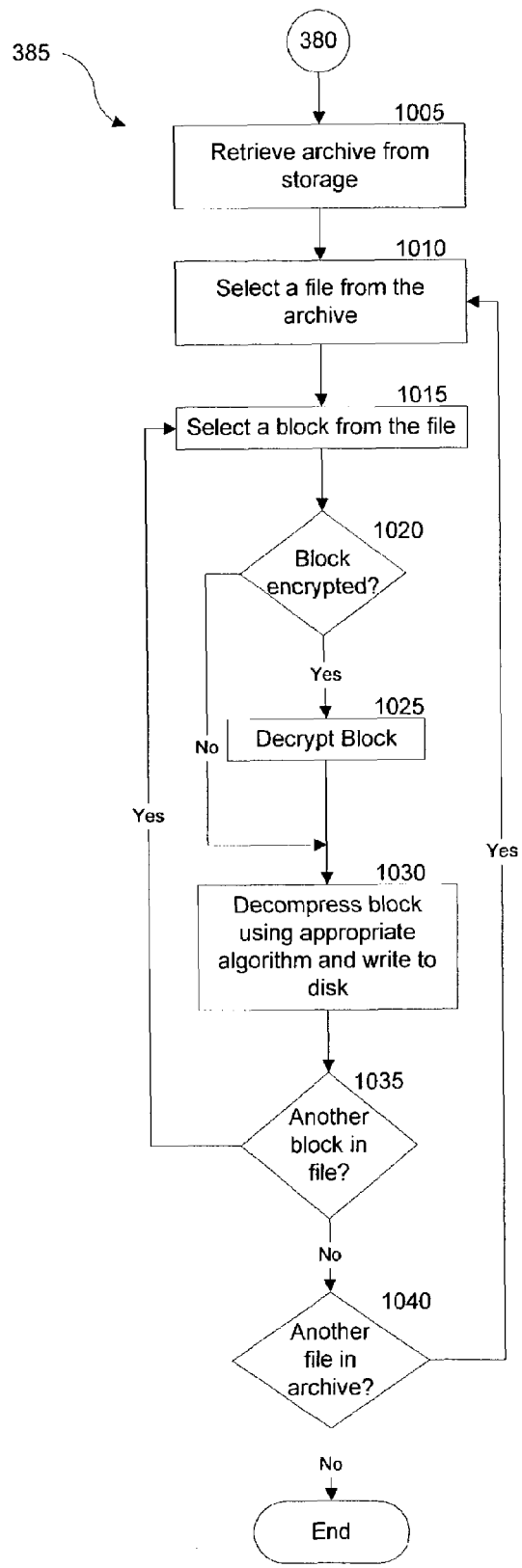
FIG. 10 is a flow chart depicting a method for decompressing a locally stored data file according to an exemplary embodiment of the present invention.

FIG. 10 is a flow chart depicting a method for decompressing a local data file according to an exemplary embodiment of the present invention, as referred to in step 385 of FIG. 3. In step 1005, the archive decoding module 116 (FIG. 1) can retrieve an archive data file from the storage medium 118. In step 1010, the archive decoding module 116 can select a compressed data file from the archive data file. In step 1015, the archive decoding module 116 can select a data block of the selected file.

In step 1020, the archive decoding module 116 can determine whether the selected data block is encrypted. If not, then the method can branch to step 1030. If yes, then the method can branch to step 1025. In step 1025, the archive decoding module 116 can decrypt the selected data block using an appropriate decryption algorithm corresponding to the encryption algorithm that encrypted the data block. The method then can proceed to step 1030.

In step 1030, the archive decoding module 116 can decompress the selected data block using an appropriate decompression algorithm corresponding to the compression algorithm that compressed the data block. Also, in step 1030, the archive decoding module 116 can write the decompressed data to the storage medium 118. Then, in step 1035, the archive decoding module 116 can determine whether another data block remains in the selected file. If yes, then the method can branch back to step 1015 to decompress another block. If not, then the method can branch to step 1040.

In step 1040, the archive decoding module 116 can determine whether another data file remains in the archive data file. If yes, then the method can branch back to step 1010 to decompress another data file.

Figure 11:
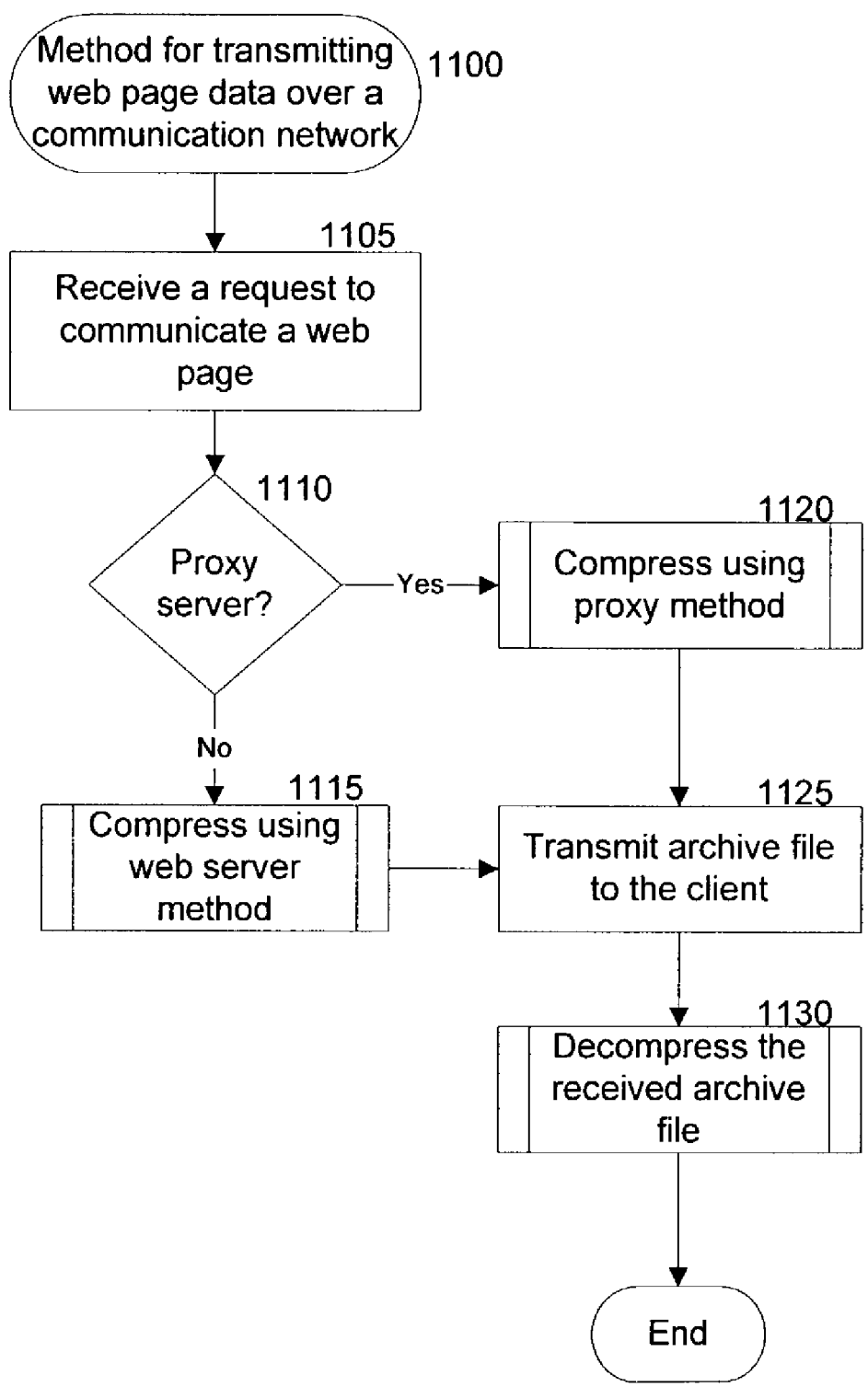
FIG. 11 is a flow chart depicting a method for compressing and decompressing web page data files in a communication network according to an exemplary embodiment of the present invention.

FIG. 11 is a flow chart depicting a method 1100 for transmitting web page data over a communication network according to an exemplary embodiment of the present invention. In step 1105, the proxy server module 242 (FIG. 2) or the web server module 244 can receive a web page request transmitted by the client 230. In step 1110, the method can determine whether the server module that received the request comprises a proxy server module. If yes, then the method can branch to step 1120. In step 1120, the proxy server module 242 can compress the requested data using a proxy method and can create a web archive data file of the compressed data. The method then can proceed to step 1125.

If the method determines in step 1110 that the server module does not comprise a proxy server module, then the method can branch to step 1115. If the server module does not comprise a proxy server module, then the method determines that the server module comprises a web server module. Accordingly, in step 1115, the web server module 244 can compress the requested data using a web server method and can create a web archive data file of the compressed data. The method then can proceed to step 1125.

In step 1125, the proxy server module 242 or the web server module 244 can transmit the web archive data file to the web browser module 234 of the client 230. Then, in step 1130, the web browser module 234 can decompress the received web archive data file for rendering as a web page on the user interface of the console 102.

Figure 12:
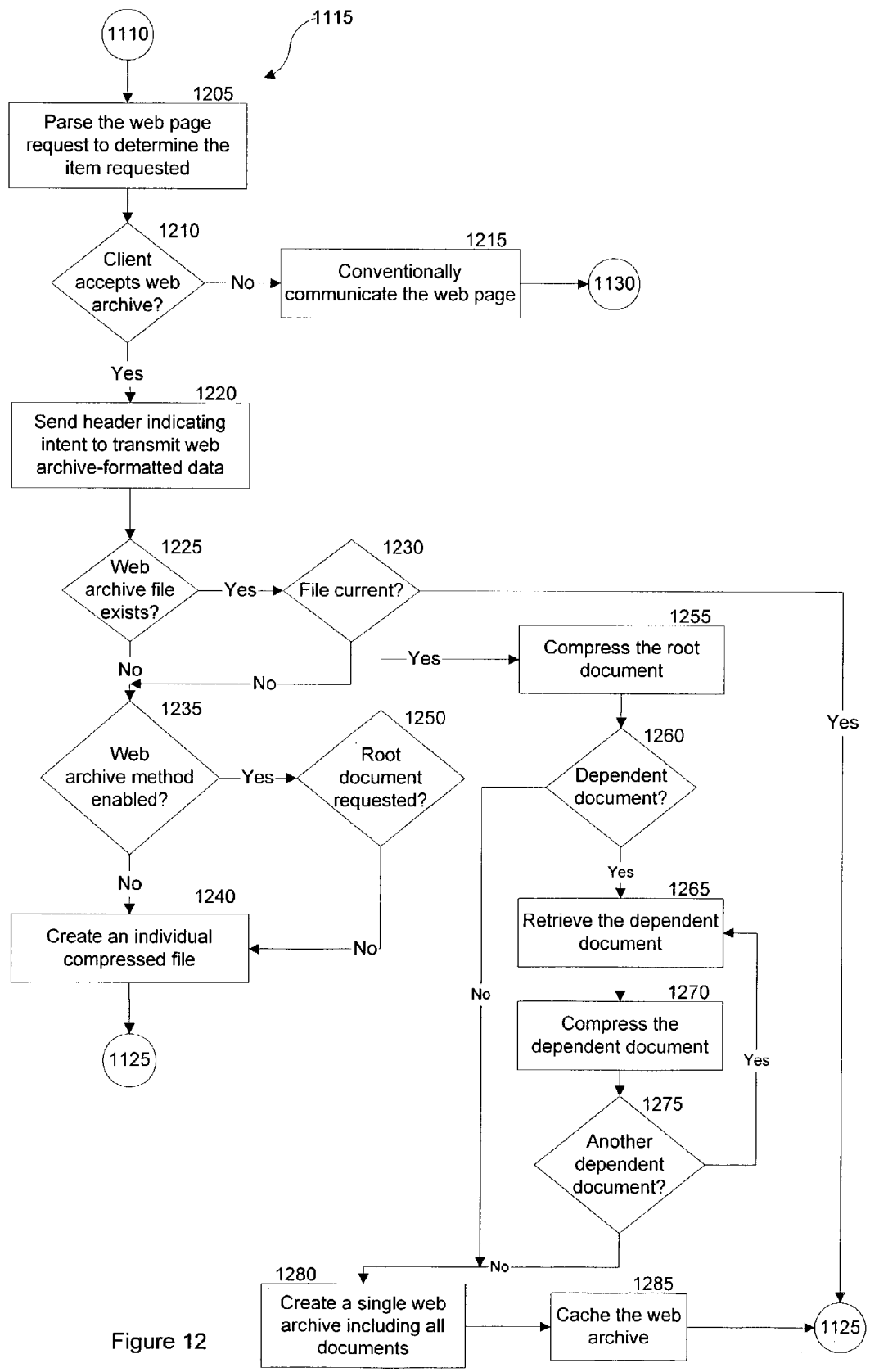
FIG. 12 is a flow chart depicting a web server method for compressing a web page data file according to an exemplary embodiment of the present invention.

FIG. 12 is a flow chart depicting a web server method for compressing data according to an exemplary embodiment of the present invention, as referred to in step 1115 of FIG. 11. In step 1205, the web server module 244 (FIG. 2) can parse the web page request to determine the data requested and header information. For example, the requested data can comprise a JPEG data file, a GIF data file, or a root document data file of a web page. The header information can comprise information indicating whether the client accepts data files of the web archive format. In step 1210, the web server module 244 can determine from the header information whether the client 230 accepts data files of the web archive format. If not, then the method can branch to step 1215. In step 1215, the web server module 244 can conventionally communicate the web page. The method then can proceed to step 1130 (FIG. 11).

If the web server module 244 determines in step 1210 that the client accepts data of the web archive format, then the method can branch to step 1220. In step 1220, the web server module 244 can send a header to the client 230. The header can indicate the web server module's 244 intent to transmit web archive-formatted data. Then, in step 1225, the web server module 244 can determine whether a web archive data file of the requested data exists in the web server module's 244 cache. If yes, then the method can branch to step 1230. In step 1230, the web server module 244 can determine whether the cached web archive data file is current. If yes, then the method can branch to step 1125 (FIG. 11) to transmit the cached web archive data file to the client 230.

If the web server module determines in step 1230 that the cached web archive data file is not current, then the method can branch to step 1235. Referring back to step 1225, if the web server module 244 determines that a web archive data file does not exist in cache, then the method can branch directly to step 1235.

In step 1235, the web server module 244 can determine whether a web archive method is enabled. The web archive method can allow creation of a web archive comprising compressed versions of the requested files. Enablement of the web archive method can be configurable. Alternatively, the web archive method can be enabled by dynamically determining if a web archive containing dependent documents should be created based on the size of the dependent documents. If the dependent documents are too large, then it can be determined not to create a web archive. For example, the creation of a web archive including overly large dependent documents can increase the delay before the web browser module 234 (FIG. 2) receives the requested document. If the method determines in step 1235 that the web archive method is not enabled, then the method can branch to step 1240. In step 1240, the web server module 244 can create an individually compressed data file for each requested data file. The individually compressed file can comprise a compressed version of the requested file. The method then can proceed to step 1125 (FIG. 11).

Referring back to step 1235, if the web server module 244 determines that the web archive method is enabled, then the method can branch to step 1250. In step 1250, the web server module 244 can determine whether the requested file comprises a root document file. The requested file comprises a root document file if it comprises a main document that refers to other dependent documents. If the document does not comprise a root document file, then the method can branch to step 1240, described above. The method can branch to step 1240 because the request involves files after an initial request for a web page. The initial request for a web page comprises a request for a root document file. Accordingly, if the request is not for a root document file, then the web page request comprises a request for a dependent document file of the web page. Thus, the method can create the requested dependent document file in step 1240.

If the web server module 244 determines in step 1250 that the document requested comprises a root document file, then the method can proceed to step 1255. In step 1255, the web server module 244 can compress the root document file. In step 1260, the web server module 244 can determine whether the root document file refers to a dependent document file. If yes, then the method can branch to step 1265. In step 1265, the web server module 244 can retrieve the dependent document file. Then, in step 1270, the web server module 244 can compress the dependent document file.

In step 1275, the web server module 244 can determine whether the root document refers to another dependent document file. If yes, then the method can branch back to step 1265 to process another dependent document file. If not, then the method can branch to step 1280. Referring back to step 1260, if the web server module 244 determines that the root document does not refer to a dependent document file, then the method can branch directly to step 1280.

In step 1280, the web server module 244 can create a single web archive comprising a compressed version of the root document file and compressed versions of the dependent document files. In step 1285, the web server module 244 can cache the web archive data file for future use. From step 1285, the method can proceed to step 1125 (FIG. 11).

Accordingly, an exemplary embodiment of the present invention can automatically retrieve the document files that depend from the root document file. The root document file and each dependent document file can be compressed and then stored in a web archive data file for transmission to the client 230. The web archive format of the exemplary embodiment can encapsulate the entire web page including all supporting files into one compressed document file. The compressed document then can be transmitted over one TCP/IP connection. Thus, the exemplary embodiment can decrease transmission time by transmitting compressed versions of the files in a single archive data file. Additionally, the exemplary embodiment can decrease response time by avoiding a second request from the client 230 for the dependent files.

For the exemplary embodiment described with reference to FIG. 12, the web server module 244 can perform the compression steps using conventional compression methods. Additionally, the web server module 244 can perform the compression steps using file scope compression or distributed compression described above with reference to FIGS. 4 and 5.

In an exemplary embodiment, the web server module 244 can execute an "Apache" server module that is modified to perform as described in FIG. 12.

Figure 13:
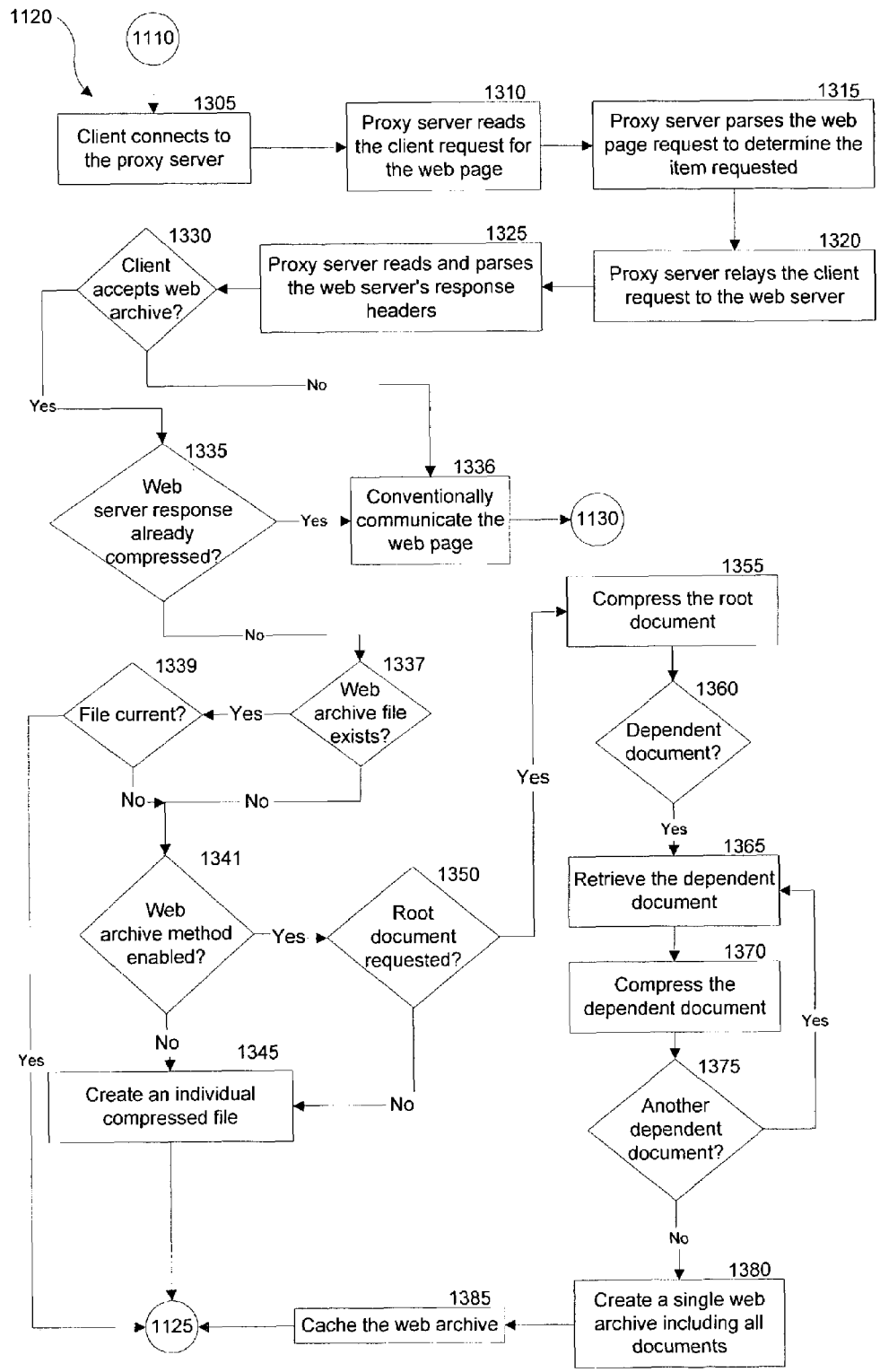
FIG. 13 is a flow chart depicting a proxy method for compressing a web page data file according to an exemplary embodiment of the present invention.

FIG. 13 is a flow chart depicting a proxy method for compressing a web page data file according to an exemplary embodiment of the present invention, as referred to in step 1120 of FIG. 11. In step 1305, the client 230 can connect to the proxy server module 242. In step 1310, the proxy server module 242 can read the web page request from the web page request module 232 of the client 230. In step 1315, the proxy server module 242 can parse the web page request to determine the item requested. The proxy server module 242 can relay the client request to the web server module 244 in step 1320. After receiving the client request from the proxy server module 242, the web server module can respond. In step 1325, the proxy server module can read and parse the web server module's 244 response headers. The web server module's 244 response headers can comprise information regarding which document files were requested and whether the proxy server module's 242 cached version of requested document files is current. The web server module's 244 response headers also can indicate complete uncompressed copies of the requested document files. Alternatively, web server module's 244 response headers can indicate a web archive data file of the requested document files.

In step 1330, the proxy server module 242 can determine whether the web browser module 234 of the client 230 accepts web archive data. If not, then the method can branch to step 1336. In step 1336, the proxy server module 242 can conventionally communicate the web page. The method then can proceed to step 1130 (FIG. 11).

If the proxy server module 242 determines in step 1330 that the client 230 accepts web archive-formatted data, then the method can proceed to step 1335. In step 1335, the proxy server module 242 can determine whether the response from the web server is already conventionally compressed. If yes, then the method can branch to step 1336 to conventionally communicate the web page to the client 230. For example, if the web server response comprises a JPEG file, typically in a highly compressed state, then the proxy server module 242 can conventionally communicate the JPEG file to the client 230.

If the proxy server module 242 determines in step 1335 that the web server response is not already compressed, then the method can branch to step 1337. In step 1337, the proxy server module 242 can determine whether a web archive data file of the requested data exists in the proxy server module's 242 cache. Alternatively, in step 1337, the proxy server module can determine if the web server module's 244 response included a web archive data file of the web page. If yes, then the method can branch to step 1339. In step 1339, the proxy server module 242 can determine whether the existing web archive data file is current. If yes, then the method can branch to step 1125 (FIG. 11) to transmit the cached archive data file to the client 230.

If the proxy server module 242 determines in step 1339 that the existing web archive data file is not current, then the method can branch to step 1341. Referring back to step 1337, if the proxy server module 242 determines that a web archive data file does not exist, then the method can branch directly to step 1341.

In step 1341, the proxy server module 242 can determine whether a web archive method is enabled. The web archive method can allow creation of a web archive comprising compressed versions of the requested files. Enablement of the web archive method can be provided as discussed above with reference to FIG. 12. If the method determines in step 1341 that the web archive method is not enabled, then the method can branch to step 1345. In step 1345, the proxy server module 242 can create an individually compressed data file for each requested file. The individually compressed data file can comprise a compressed version of the requested file. The method can then proceed to step 1125 (FIG. 11).

Referring back to step 1341, if the proxy server module 242 determines that the web archive method is enabled, then the method can branch to step 1350. In step 1350, the proxy server module 242 can determine whether the requested file comprises a root document file. If the requested document does not comprise a root document file, then the method can branch to step 1345, described above, to create the requested dependent document file.

If the proxy server module 242 determines in step 1350 that the document requested comprises a root document file, then the method can branch to step 1355. In step 1355, the proxy server module 242 can compress the root document file. In step 1360, the proxy server module 242 can determine whether the root document file refers to a dependent document file. If yes, then the method can branch to step 1365. In step 1365, the proxy server module 242 can retrieve the dependent document file. Then, in step 1370, the proxy server module 242 can compress the dependent document file.

In step 1375, the proxy server module 242 can determine whether the root document file refers to another dependent document file. If yes, then the method can branch back to step 1365 to process another dependent document file. If not, then the method can branch to step 1380. Referring back to step 1360, if the proxy server module 242 determines that the root document file does not refer to a dependent document file, then the method can branch directly to step 1380.

In step 1380, the proxy server module 242 can create a single web archive comprising a compressed version of the root document file and compressed versions of the dependent document files. In step 1385, the proxy server module 242 can cache the web archive data file for future use. From step 1385, the method can branch to step 1125 (FIG. 11).

Accordingly, an exemplary embodiment of the present invention can automatically retrieve the document files that depend from the root document file. The root document file and each dependent document file can be compressed and then stored in a web archive data file for transmission to the client 230. The web archive format of the exemplary embodiment can encapsulate the entire web page including all supporting files into one compressed document file. That compressed document then can be transmitted over one TCP/IP connection. Thus, the exemplary embodiment can decrease transmission time by transmitting compressed versions of the files in a single archive data file. Additionally, the exemplary embodiment can decrease response time by avoiding a second request from the client 230 for the dependent files.

For the exemplary embodiment described with reference to FIG. 13, the proxy server module 242 can perform the compression steps using conventional compression methods. Additionally, the proxy server module 242 can perform the compression steps using file scope compression or distributed compression described above with reference to FIGS. 4 and 5.

Figure 14:
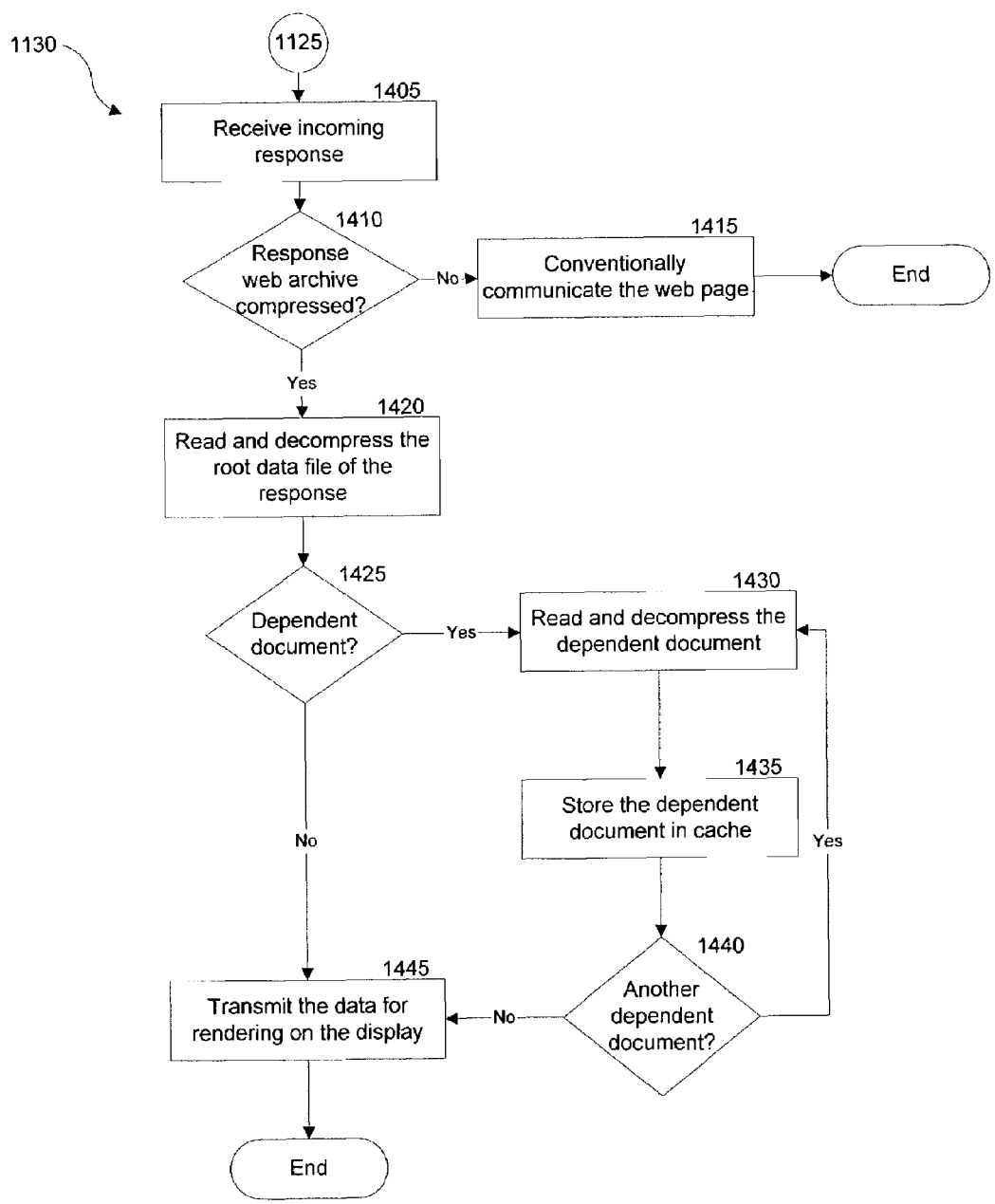
FIG. 14 is a flow chart depicting a method for decompressing a web archive data file according to an exemplary embodiment of the present invention.

FIG. 14 is a flow chart depicting a method for decompressing a web archive data file according to an exemplary embodiment of the present invention, as referred to in step 1130 of FIG. 11. In step 1405, the web browser module 234 can receive an incoming response from either the proxy server module 242 or the web server module 244. The response can comprise a web archive data file or an individually compressed data file. In step 1410, the web browser module 234 can determine if the response comprises a file in the web archive compressed format. If not, then the method can branch to step 1415. In step 1415, the web browser module 234 can conventionally communicate the web page for display on the console 202.

If step 1410 determines that the response comprises a web archive data file, then the method can branch to step 1420. In step 1420, the web browser module 234 can read and decompress the root document file of the response. In step 1425, the web browser module 234 can determine whether the response comprises a dependent document file. If yes, then the method can branch to step 1430.

In step 1430, the web browser module 234 can read and decompress the dependent document file. In step 1435, the web browser module 234 can store the dependent document in cache. Then, in step 1440, the web browser module 234 can determine whether the response comprises another dependent document file. If yes, then the method can branch back to step 1430 to process another dependent document file. If not, then the method can branch to step 1445.

Referring back to step 1425, if the web browser module 234 determines that the response does not comprise a dependent document file, then the method can branch directly to step 1445. In step 1445, the web browser module 234 can transmit the decompressed data for rendering on the user interface of the console 102.

The present invention can be used with computer hardware and software that performs the methods and processing functions described above. As will be appreciated by those skilled in the art, the systems, methods, and procedures described herein can be embodied in a programmable computer, computer executable software, or digital circuitry. The software can be stored on computer readable media. For example, computer readable media can include a floppy disk, RAM, ROM, hard disk, removable media, flash memory, memory stick, optical media, magneto-optical media, DVD/CD-ROM, etc. Digital circuitry can include integrated circuits, gate arrays, building block logic, field programmable gate arrays (FPGA), etc.

Although specific embodiments of the present invention have been described above in detail, the description can be merely for purposes of illustration. Various modifications of, and equivalent steps corresponding to, the disclosed aspects of the exemplary embodiments, in addition to those described above, can be made by those skilled in the art without departing from the spirit and scope of the present invention defined in the following claims, the scope of which is to be accorded the broadest interpretation so as to encompass such modifications and equivalent structures.

What is claimed is:

1. A system for performing distributed compression of a data file, comprising: a master server module operable for breaking the data file into a first data block and a second data block and for assigning a first compression algorithm to the first data block and a second compression algorithm to the second data block; a first worker server module operable for receiving the first data block from said master server module and for compressing the first data block using the first compression algorithm; a second worker server module operable for receiving the second data block from said master server module and for compressing the second data block using the second compression algorithm wherein said first and second worker server modules are further operable for transmitting the first and second compressed data blocks to said master server, and wherein said master server module is further operable for assembling the first and second compressed data blocks in an order corresponding to the data file.

2. The system according to claim 1, wherein the first and second algorithms comprise the same algorithm.

3. The system according to claim 1, wherein the first and second algorithms comprise different algorithms.

4. The system according to claim 1, further comprising an archive encoding module, wherein said master server module is further operable for transmitting the first and second compressed data blocks to said archive encoding module, and wherein said archive encoding module is operable for encapsulating the first and second compressed data blocks in an archive file.

5. The system according to claim 1, wherein said master server module is further operable for assigning a third compression algorithm to the first data block, and wherein said first worker server module is further operable for compressing the first data block using the third compression algorithm and for selecting a highest compressed result from the compression of the first data block using the first compression algorithm and using the third compression algorithm.

6. The system of claim 1, wherein said master server module is further operable to determine whether said first worker server module is available and for transmitting the first data block to said first worker server module in response to a determination that the first worker server module is available.

* * * * *